United States Patent
Yu et al.

(10) Patent No.: US 7,253,024 B2
(45) Date of Patent: Aug. 7, 2007

(54) DUAL-INTERFACE IC CARD BY LAMINATING A PLURALITY OF FOILS AND METHOD OF SAME

(75) Inventors: Hong Jun Yu, Seoul (KR); Jung Ho Kim, Gyeonggi-do (KR)

(73) Assignee: JT Corp., Incheon (KR)

( * ) Notice: Subject to any disclaimer, the term of this patent is extended or adjusted under 35 U.S.C. 154(b) by 202 days.

(21) Appl. No.: 10/514,436

(22) PCT Filed: Feb. 13, 2003

(86) PCT No.: PCT/KR03/00304

§ 371 (c)(1),
(2), (4) Date: May 26, 2005

(87) PCT Pub. No.: WO2004/053787

PCT Pub. Date: Jun. 24, 2004

(65) Prior Publication Data

US 2005/0224941 A1    Oct. 13, 2005

(30) Foreign Application Priority Data

Dec. 6, 2002 (KR) .................. 10-2002-0077164
Jan. 14, 2003 (KR) .................. 10-2003-0002366
Jan. 15, 2003 (KR) .................. 10-2003-0002592

(51) Int. Cl.
*H01L 21/50* (2006.01)
*H01L 23/34* (2006.01)
*H01L 23/02* (2006.01)
*H01L 21/48* (2006.01)
*H01L 21/44* (2006.01)

(52) U.S. Cl. ............... 438/107; 438/118; 257/679; 257/724

(58) Field of Classification Search ........ 438/106–127; 257/678–698, 723–731
See application file for complete search history.

(56) References Cited

U.S. PATENT DOCUMENTS

| 6,465,880 B1* | 10/2002 | Dobashi et al. ............. 257/679 |
| 6,593,167 B2* | 7/2003 | Dobashi et al. ............. 438/107 |
| 6,841,871 B2* | 1/2005 | Usami ........................ 257/724 |
| 2006/0214280 A1* | 9/2006 | Mizuno et al. ............. 257/692 |

FOREIGN PATENT DOCUMENTS

| JP | 61-034687 | 2/1986 |
| JP | 61-131185 | 6/1986 |
| JP | 03-112690 | 5/1991 |
| JP | 10-255011 | 9/1998 |
| JP | 12-315249 A | 11/2000 |

* cited by examiner

Primary Examiner—Cuong Nguyen
(74) Attorney, Agent, or Firm—Clark Hill PLC

(57) ABSTRACT

The present invention provides a method for manufacturing IC card by laminating a plurality of foils. The method of the present invention includes steps of putting a COB, a contact electrode of the COB facing downward; laying at least 2 foils having a hole, wherein said COB is inserted in said respective holes of the foils; laying a foil not having a hole on the foils having a hole; and compressing all of the foils.

30 Claims, 10 Drawing Sheets

DUAL-INTERFACE IC CARD BY LAMINATING A PLURALITY OF FOILS AND METHOD OF SAME

FIELD OF THE INVENTION

The present invention relates to a method of manufacturing an IC card, and more particularly, to a method of manufacturing a dual-interface IC card in which two or more foils having corresponding holes formed therein are stacked on a chip-on-board (hereinafter, referred to as "COB") and are then compressed each other.

BACKGROUND OF THE INVENTION

A card on which data and programs are mounted on a COB, i.e., an IC card has been increasingly used in a variety of fields due to its convenience and the ability to retain information. Such an IC card is mainly classified into a contact type IC card to/from which information is inputted/outputted as a terminal for a card reader and an electrode are brought into contact with each other, a non-contact type IC card to/from which information is inputted/outputted through an antenna even without contacting the terminal for the card reader, and a combi type IC card (also referred to as "dual-interface IC card") having both the functions of the contact and non-contact type cards.

The dual-interface IC card is manufactured by stacking a plurality of foils (also referred to as "sheet") to form a card shape, digging a groove 900 having a predetermined size by means of a milling process so that a COB 200 can be mounted in the groove 900, inserting the COB 200 into the groove 900, and then covering the resulting surface with at least one cover foil, as shown in FIG. 1. This method, however, needs a process of digging the groove 900 for the COB 200 in a card base that is roughly formed by stacking the plurality of the foils. Due to this, this method has a disadvantage that the process is dually performed. In particular, in manufacturing the combi type IC card, after the COB is inserted into the groove with an electrode surface for a contact terminal exposed outwardly, an antenna electrodes of the COB and an antenna on which a conductive wire is wound in a given form must be electrically connected. This makes it very difficult for a worker to connect both ends of the antenna and the antenna electrodes of the COB in a state where the worker does not see the both ends of the antenna and the antenna electrodes.

In other words, in a state where the ends of the antenna are exposed toward the inside of the groove, the COB is inserted into the groove with a molding element directed downwardly. In this case, the antenna electrodes formed in a main board of the COB must be electrically connected to the both ends of the antenna. At this time, as the COB is located between the eyes of the worker and the groove, i.e., the antenna connection elements, this veils the visual field of the worker (in other words, electrodes to be connected to the antenna are located at the rear of the main board that is not seen by the worker). For this reason, a conductive paste (or adhesive) is covered on both ends of the antenna exposed toward the inside of the groove, and the COB is inserted/then compressed, or a hot melt sheet is adhered and the COB is inserted and then thermally compressed.

However, the electrical connection of the antenna connection elements and the COB electrodes becomes unsatisfactory through such adhesion method. In this case, if the IC card is used for a long time, there is a problem that the electrical connection may be disconnected or the COB itself may be separated from the card. Furthermore, in order to insert the COB into the groove formed in the stacked foil, it is inevitable that the area of the groove is greater than the area of the COB in structure even a little. Accordingly, in case of a completed IC card, a gap may exist between the COB and the groove. This gap may cause a possibility that moisture is infiltrated. Further, if the card is bent, the COB may be deviated from the card plate through the gap.

OBJECTS OF THE INVENTION

Accordingly, the present invention has been made in view of the above problems, and it is an object of the present invention to provide a dual-interface IC card and a method of manufacturing the dual-interface IC card that can obviate the process of digging a groove again after foils are stacked.

Another object of the present invention is to provide a dual-interface IC card and a method of manufacturing the dual-interface IC card in which a COB and foils can be strongly coupled.

Still another object of the present invention is to provide a dual-interface IC card and a method of manufacturing the dual-interface IC card that can minimize a gap between the COB and the foils.

Still another object of the present invention is to provide a dual-interface IC card and a method of manufacturing the dual-interface IC card in which an electrode and antenna electrodes of a COB can be strongly coupled.

Still another object of the present invention is to provide a dual-interface IC card and a method of manufacturing the dual-interface IC card in which a half-finished product manufacturing process and a finished product manufacturing process are separated.

Still another object of the present invention is to provide a dual-interface IC card and a method of manufacturing the dual-interface IC card having a high smoothness.

Still another object of the present invention is to provide a dual-interface IC card and a method of manufacturing the dual-interface IC card, which can solve a problem that a hole into which a COB is inserted is contracted due to thermal compression in the IC card half-finished product manufacturing process.

According to a first aspect of the present invention, a method of manufacturing a dual-interface IC card does not include the step of digging a groove for inserting a COB into a foil after the foil is stacked. To this end, the method of manufacturing the dual-interface IC card includes the step of forming a hole for inserting the COB into at least one foil, and then stacking and compressing the COB and the foil. In the concrete, the method of manufacturing the IC card includes the steps of disposing the COB so that an electrode surface for a terminal of a COB is oriented downwardly, stacking two or more foils having a hole of a size into which the COB can be inserted so that the COB is inserted into the hole, stacking a foil having a hole not formed therein on the foils, and then compressing the stacked foils.

In a second aspect of the present invention of the method of manufacturing the dual-interface IC card, a process of electrically connecting an antenna formed in a foil to an electrode formed in a COB is facilitated. Accordingly, a physical bonding strength between the antenna and the COB electrode becomes strong and an additional adhesive, etc. can be easily used. This results from the process of electrically connecting the antenna formed in the antenna foil and the antenna electrodes of the COB in a state where the antenna electrodes of the COB is disposed upwardly. In the concrete, the COB is disposed so that an electrode surface for a contact terminal of a COB is disposed downwardly. At least one foil having a hole into which the main board of the COB can be inserted formed therein is first stacked so that the COB is inserted into the hole. Next, an antenna foil in which the antenna is formed and the other hole corresponding to the location of the hole is formed, is stacked so that the other hole is inserted into the molding element of the COB. Both ends of the antenna are then electrically connected to the antenna electrodes of the COB. Thereafter, the other foil is stacked at the opposite side to the side that the electrode surface for the contact terminal of the COB is exposed toward the outside. The stacked foils are then compressed. At this time, the molding element of the COB and the antenna electrodes are exposed upwardly through the hole formed in the antenna foil.

In a third aspect of the method of manufacturing the dual-interface IC card, the method is divided into a first step half-finished product process and a second finished product process and is compatible with a common practice of manufacturing the dual-interface IC card. Also, in a final finished product manufacturing process, a conventional production line (that is, a printing equipment, an equipment for stacking and compressing printed foils, etc.) is used intact. To this end, the method of manufacturing the dual-interface IC card includes the first step half-finished product manufacturing process, including the steps of forming a hole through which a molding element and antenna electrodes of a COB are exposed at a predetermined location, inserting the wound antenna foil into the molding element of the COB so that both ends of the antenna are exposed toward the inside of the hole, electrically connecting the both ends of the antenna to the antenna electrodes of the COB, stacking a foil having a hole not formed therein on an opposite side to the side for a terminal of the COB that is outwardly exposed, and compressing the stacked foils; and a second step finished product process, including the steps of stacking at least one foil having a hole into which the main board of the COB can be inserted so that the foil has a thickness substantially same as a thickness of the main board of the COB, and compressing the entire stacked foils.

According to a fourth aspect of a method of manufacturing the dual-interface IC card, an antenna and electrodes of a COB have a strong bonding strength. In other words, this method includes the step of adhering an antenna formed in an antenna foil and antenna electrodes of the COB through ultrasonic welding, application of a conductive adhesive or adhesion using a hot melt sheet, in a state where the antenna electrodes of the COB are exposed upwardly. In a conventional method of manufacturing an IC card, the COB itself prevents a worker's visual field. It is thus difficult to directly connect the antenna and the antenna electrodes of the COB.

According to a fifth aspect of a method of manufacturing the dual-interface IC card, a bonding strength between a COB and a foil stacked on the COB is doubled by a hot melt sheet. For this purpose, this method further includes the step of adhering a hot melt sheet in which a hole to expose a molding element and antenna electrodes of the COB are formed on a main board of the COB. By including this step, the bottom of the hot melt sheet is adhered to the main board, and the top of the hot melt sheet is adhered to the foil that is subsequently stacked on the hot melt sheet through thermal compression.

According to a sixth aspect of a method of manufacturing the dual-interface IC card, a method of manufacturing the dual-interface IC card having a high smoothness is provided. For this, this method includes the steps of applying a filler between a molding element of a COB and a foil stacked on the molding element, and/or applying a filler to a portion in which an antenna and antenna electrodes of the COB are electrically connected.

According to a seventh aspect of a method of manufacturing an dual-interface IC card, there is provided a manufacturing method of preventing problems that a hole formed in an antenna foil can thermally shrink due to first thermal compression in a step half-finished product manufacturing process and a COB of the IC card can be deviated from the card plate through a gap between the COB and the card plate when the card is bent. To this end, this method includes the steps of compressing a lamination foil onto the antenna foil in which the antenna is formed to form a base foil, forming a hole into which the molding element of a COB is inserted in the base foil, inserting the hole of the base foil into the molding element of the COB, electrically connecting the antenna electrodes of the COB and the antenna, and stacking the foil having a hole not formed therein on the base foil and then tack-welding the foil.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE INVENTION

The present invention will now be described in detail in connection with preferred embodiments with reference to the accompanying drawings.

Figure 1:
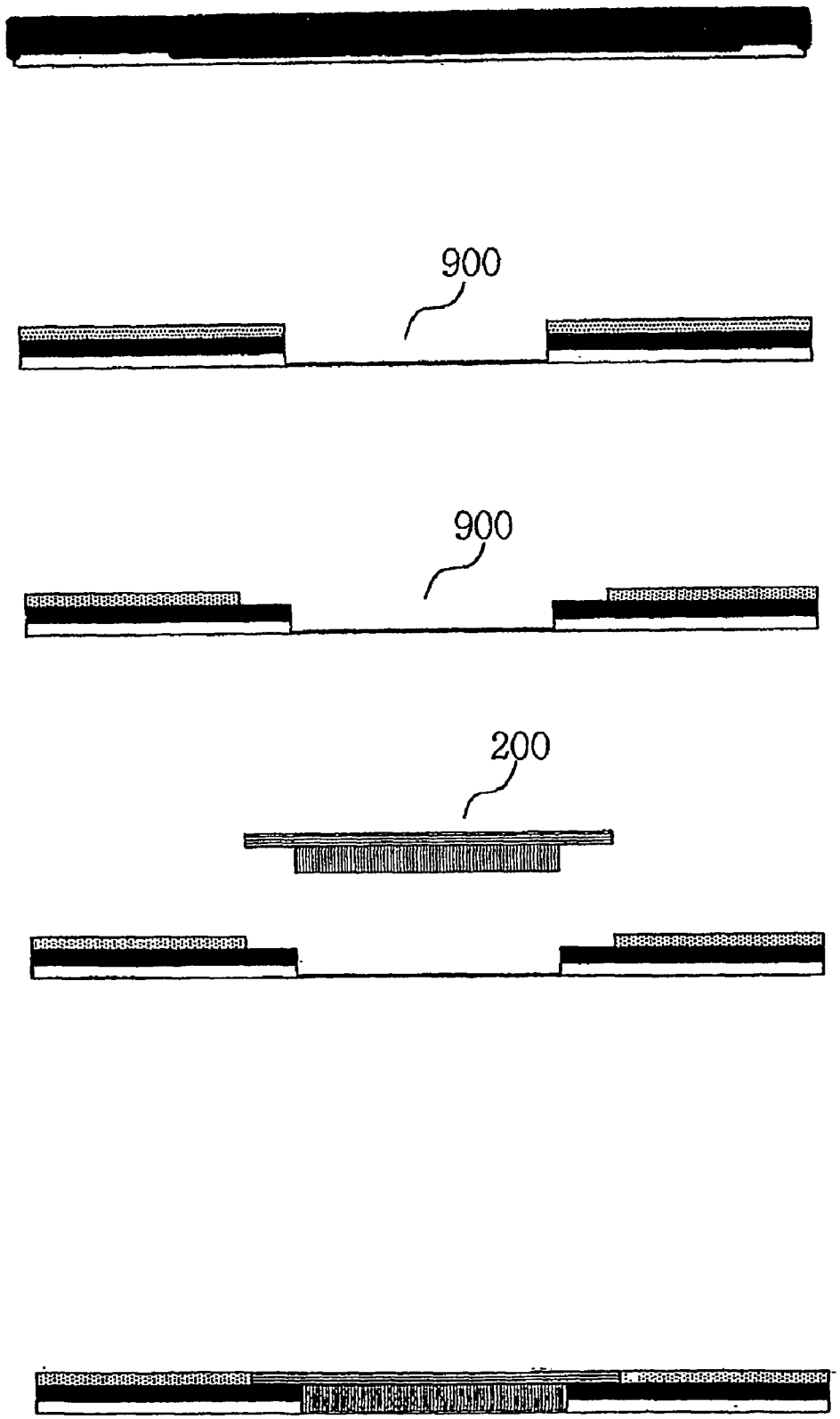
FIG. 1 is a cross-sectional view schematically shown to explain a method of manufacturing the dual-interface IC card according to a prior art.
Figure 2A:
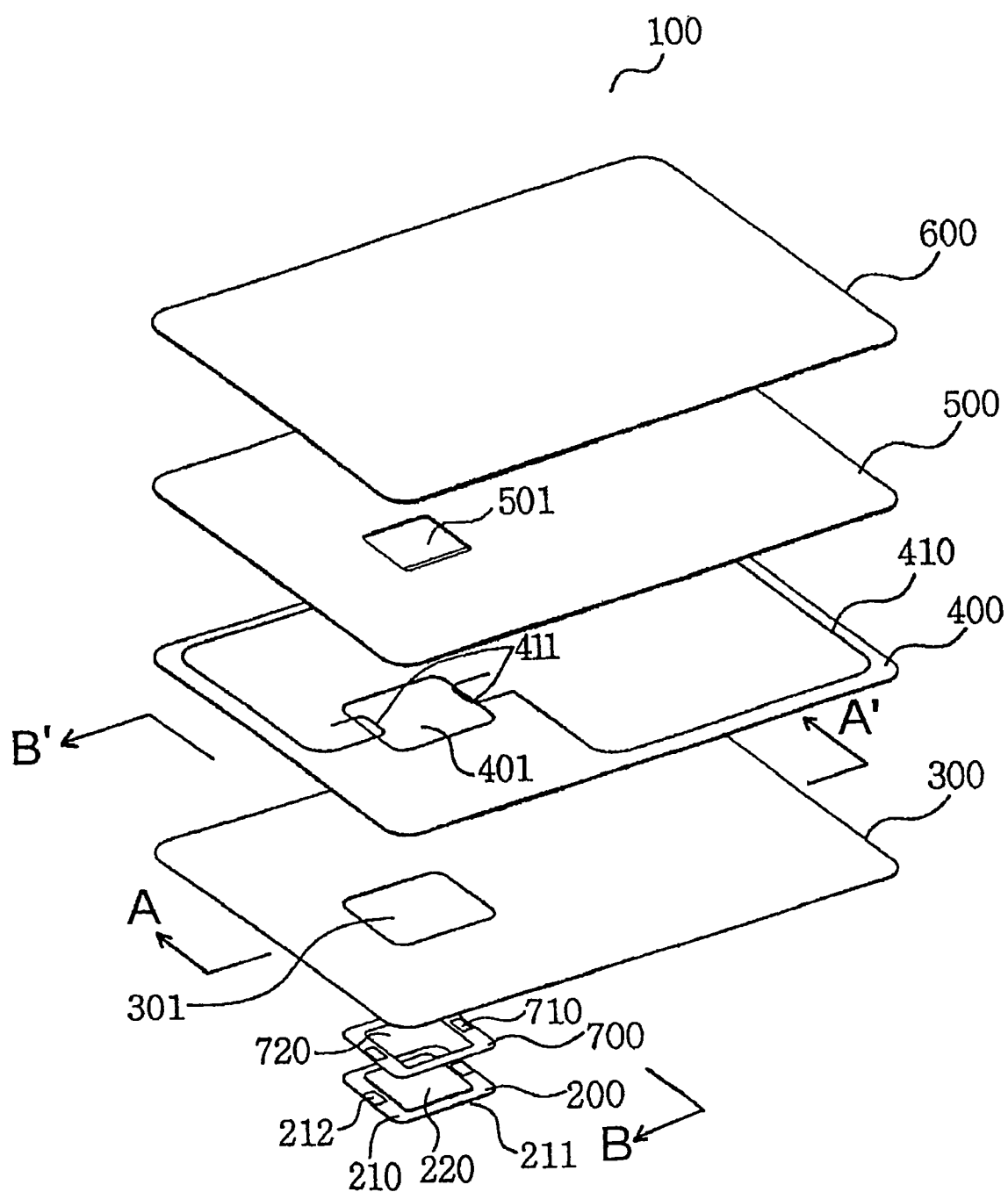
FIG. 2(A) is a perspective view shown to explain a method of manufacturing a dual-interface IC card according to an embodiment of the present invention.
Figure 2B:
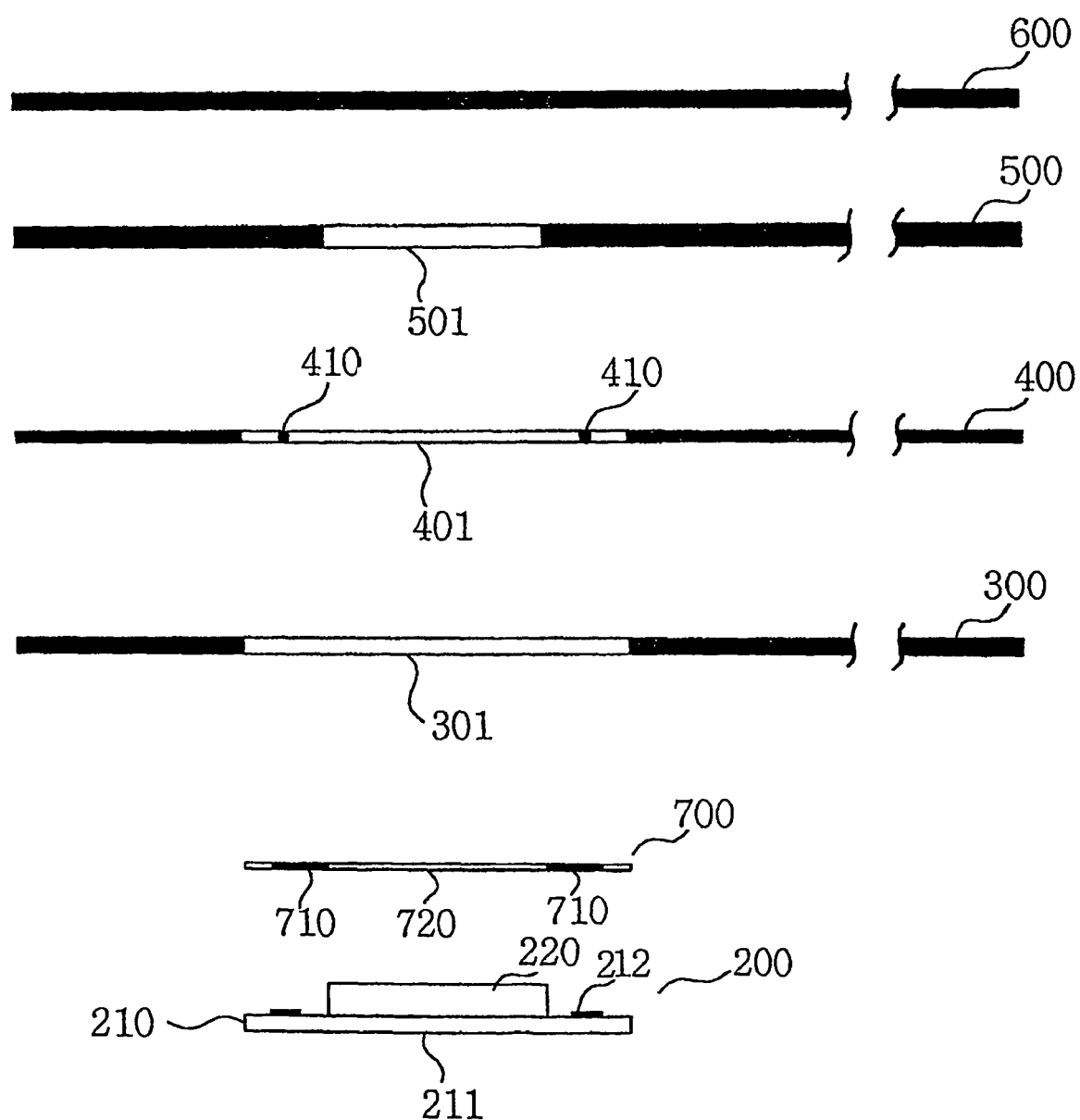
FIG. 2(B) is a cross-sectional view of the IC card shown in FIG. 2(A)

FIG. 2(A) is a perspective view shown to explain a method of manufacturing a dual-interface IC card according to an embodiment of the present invention, and FIG. 2(B) is a cross-sectional view of the dual-interface IC card shown in FIG. 2(A).

The dual-interface IC card 100 of the present invention has a plurality of foils stacked thereon. One work plate (not shown) that is substantially flat is first laid on the floor. A COB 200 is then placed on the work plate. It is preferred that the work plate is a metal plate having a predetermined thickness. Though it will be described later, the metal plate has an advantage that it can be easily thermally compressed onto the work plate. The COB 200 is a common COB and has a structure in which a chip of a wafer state is disposed on a main board 210 and a molding element 220 is formed on the chip. The molding element 220 does not necessarily refer to only molding, but may refer to anything that can protect the chip, including potting. In the COB 200 for use in a contact type card among such a COB, the bottom of the main board 210, i.e., an opposite side in which the molding element 220 is formed becomes an electrode surface 211 for an external terminal. Furthermore, in the COB 200 for use in a combi type card, a pair of antenna electrodes 212 to be connected to an antenna 410 are formed on the main board 210, and the bottom of the main board 210 becomes the electrode surface 211 for the external terminal in the same manner. When placing the COB 200 on the work plate, the electrode surface 211 for the terminal of the COB 200 is disposed to face the work plate. It is thus possible to see the molding element 220 from the upper direction. Hereinafter, "upper direction" refers to a direction that directs from reference numeral 600 to reference numeral 300 and "lower direction" refers to a direction that directs from reference numeral 300 to reference numeral 600. Hereinafter, a method of manufacturing the combi type IC card will be first described.

A hot melt two-sided sheet 700, i.e., the bottom of the sheet 700 on both ends of which an adhesive material melt and adhered by heat is formed, is adhered to portions except for the molding element 220 and the antenna electrode 212 of the COB 200. The top of the sheet 700 is adhered to a core foil 500, which will be described later on. An oilpaper is preferably formed on the top of the hot melt two-sided sheet 700. Thus, a worker can adhere the core foil 500 to the hot melt two-sided sheet 700 after stripping off the oilpaper. It is preferred that the hot melt sheet 700 is not greater than the outermost edge portion of the COB 200, i.e., the main board 210 portion. It is more preferable that the portion adhered to the core foil 500 becomes wide by maximum by making the outermost edge of the hot melt sheet 700 substantially coincident with the outermost edge of the main board 210.

Furthermore, a pair of sheet holes 710 or "⊏" shaped grooves are formed in the portion contacting the antenna electrodes 212 of the hot melt sheet 700, so that antenna connection elements 411 to be described later and the antenna electrodes 212 can be electrically connected through ultrasonic welding, adhesion using a conductive adhesive, soldering, etc. A central hole 720 into which the molding element 220 is inserted (preferably, having substantially the same size as the molding element 220), is formed at the central portion of the hot melt sheet 700.

If the COB 200 to which one side of the hot melt sheet 700 is adhered is located on the work plate, a front cover foil 300 having a hole (hereinafter, referred to as "first hole" 301) of substantially the same size as the main board 210 of the COB 200 is laid on the work plate, while the first hole 301 is being inserted into the main board 210. At this time, it is preferred that as the first hole 301 and the main board 210, i.e., the outermost edge portion of the COB 200 are approaching by maximum, the size of the adjacent holes is mated. The front cover foil 300 functions to protect the IC card 100 according to the present invention from moisture, etc. and is preferably made of a transparent coating film. In the above, the process of laying the front cover foil 300 may be omitted, if necessary, which will be described later.

If the front cover foil 300 is laid on the work plate, an antenna foil 400 having an antenna 410 formed thereon is stacked on the front cover foil 300 (the process of forming the antenna is known in the art and the shape of the antenna may differ from that shown in the drawing). At this time, a second hole 401 is formed in the antenna foil 400. The size of the second hole 401 is determined so that the molding element 220 and the antenna electrodes 212 of the COB 200 can be exposed when viewed by the worker from the upper direction. Further, the second hole 401 may have the same shape as the first hole 301. If the second hole 401 has a different shape from the first hole 301, it is important to expose the molding element 200 and the antenna electrodes 212.

In the drawing, it is shown that the antenna connection elements 411 are exposed toward the inside of the second hole 401 in the "⊏" shape. The present invention, however, is not limited to the above example. It is important that the antenna connection elements 411 are adequately protruded toward the inside of the second hole 401 so that the portion corresponding to the antenna ends substantially corresponds to the antenna electrodes 212. It is, however, to be noted that the technical construction related to the connection of the antenna connection elements and the antenna electrodes can be easily implemented by those skilled in the art. A stacked thickness of the front cover foil 300 is made equal to a thickness of the main board 210 of the COB 200. The antenna foil 400 may be stacked after the antenna 410 is formed, or the antenna 410 may be formed after a foil having the antenna 401 not formed therein is stacked. Though not particularly specified in this context, it is construed that the antenna foil 400 includes both the two kinds.

If the antenna foil 400 is stacked, the oilpaper attached to the top of the hot melt sheet 700 is stripped off (the oilpaper may be stripped off before or after the front cover foil is stacked). The antenna connection elements 411 and the antenna electrodes 212 of the COB 200 are then electrically connected. At this time, the electrical connection may be preferably accomplished using ultrasonic welding, soldering, a conductive adhesive and the like. The end of the antenna 410, i.e., a the antenna connection elements 411 that do not make contact with the antenna electrodes 212 may be adhered to the top of the top of the hot melt sheet 700, if appropriate.

If the antenna connection elements 411 and the antenna electrodes 212 of the COB 200 are electrically connected, a core foil 500 is stacked thereon. A third hole 501 into which the molding element 220 of the COB 200 can be inserted, is formed in the core foil 500. It is preferable that the size of the third hole 501 is substantially the same area as the area of the molding element 220, and a thickness of the core foil 500 and a thickness of the molding element 220 are made same. Thus, if a stacked thickness of the front cover foil 300 and the antenna foil 400 becomes same as a thickness of the main board 210 of the COB 200, there rarely exists a gap between the COB 200, the front cover foil 300, the antenna foil 400 and the core foil 500.

If the core foil 500 is stacked, a backside cover foil 600 is stacked on the core foil 500. The backside cover foil 600 has substantially the same function as the front cover foil 300. The backside cover foil 600 is preferably made from a transparent coating film. Generally, objects for indicating a subject of the card, giving publicity, etc. are printed on the surface of the IC card. In case of the IC card of the present invention, objects are printed on the bottom of the antenna foil 400 or the top of the core foil 500. It is preferred that the printed objects are protected by the cover foils 300 and 600.

If the backside cover foil 600 is stacked, the other work plate (substantially flat metal plate) is laid on the backside cover foil 600. The two work plates are then compressed. In this case, the work plates are heated at constant temperature, whereby the plurality of the foils are well compressed with one another and the top of the hot melt sheet 700 is well adhered to the core foil 500. The hot melt sheet 700 serves to minimize the gap between the third hole 501 formed in the core foil 500 and the first and second holes 301 and 401.

It has been described above that the IC card is formed by stacking the front cover foil 300, the antenna foil 400, the core foil 500 and the backside cover foil 600, in case where the IC card of the present invention becomes a combi type card. It is, however, to be understood that the front cover foil 300 or the backside cover foil 600 may be omitted, other foils may be further inserted between the foils, and a variety of foils may be stacked, if necessary. It may be necessary that the foils 300, 400, 500 and 600 have the property that is adhered with one another when being thermally compressed. It is, however, to be noted that existing foils may be employed, if necessary.

A case where the IC card according to the present invention becomes a contact type card will be described. In the contact type card, the COB 200 does not have the antenna electrodes 212 described above. The antenna 410 is thus not formed in the antenna foil 400. Furthermore, in case of using a hot melt sheet, the sheet holes 710 for the antenna electrodes 212 is not formed. Other processes are substantially the same as those for embodying the method of manufacturing the combi type IC card. In other words, the method of manufacturing the contact type card includes laying the COB 200 on the work plate, laying the front cover foil 300 having the first hole 301 on the COB 200, and then forming the second hole 401 on the front cover foil 300 but stacking the antenna foil 400 having an antenna not formed thereon. The second hole 401 must have the size into which the molding element 220 can be inserted, preferably substantially the same as the size of the first hole 301. Next, the core foil 500 having the third hole 501 corresponding to the molding element 220 is stacked. The backside cover foil 600 is then stacked on the core foil 500.

It has been described above that the COB 200 is placed on the work plate, and the front cover foil 300 and the antenna foil 400 are then stacked. However, the COB 200 may be inserted into the holes 301 and 401 after the front cover foil 300 and the antenna foil 400 are stacked while the positions of the first hole 301 and second hole 401 are adequately aligned. In this case, if the antenna foil 400 is stacked on the front cover foil 300, the COB 200 may be inserted into the holes 301 and 401 after the stacked foils 300 and 400 are turned over. Other processes are substantially the same as those for embodying the method of manufacturing the combi type IC card or the contact type IC card.

Figure 3A:
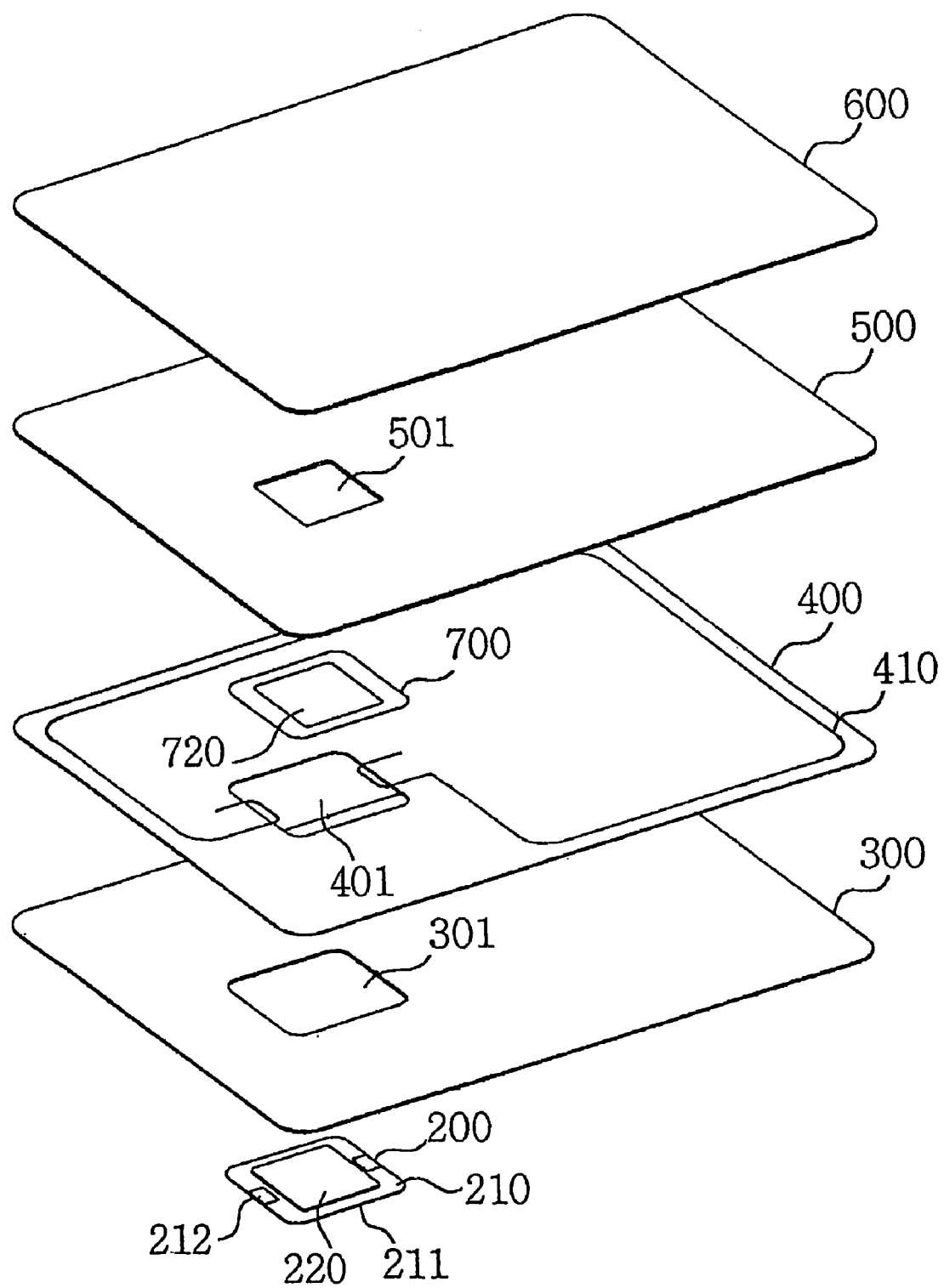
FIG. 3(A) is a perspective view shown to explain a method of manufacturing a dual-interface IC card according to another embodiment of the present invention.
Figure 3B:
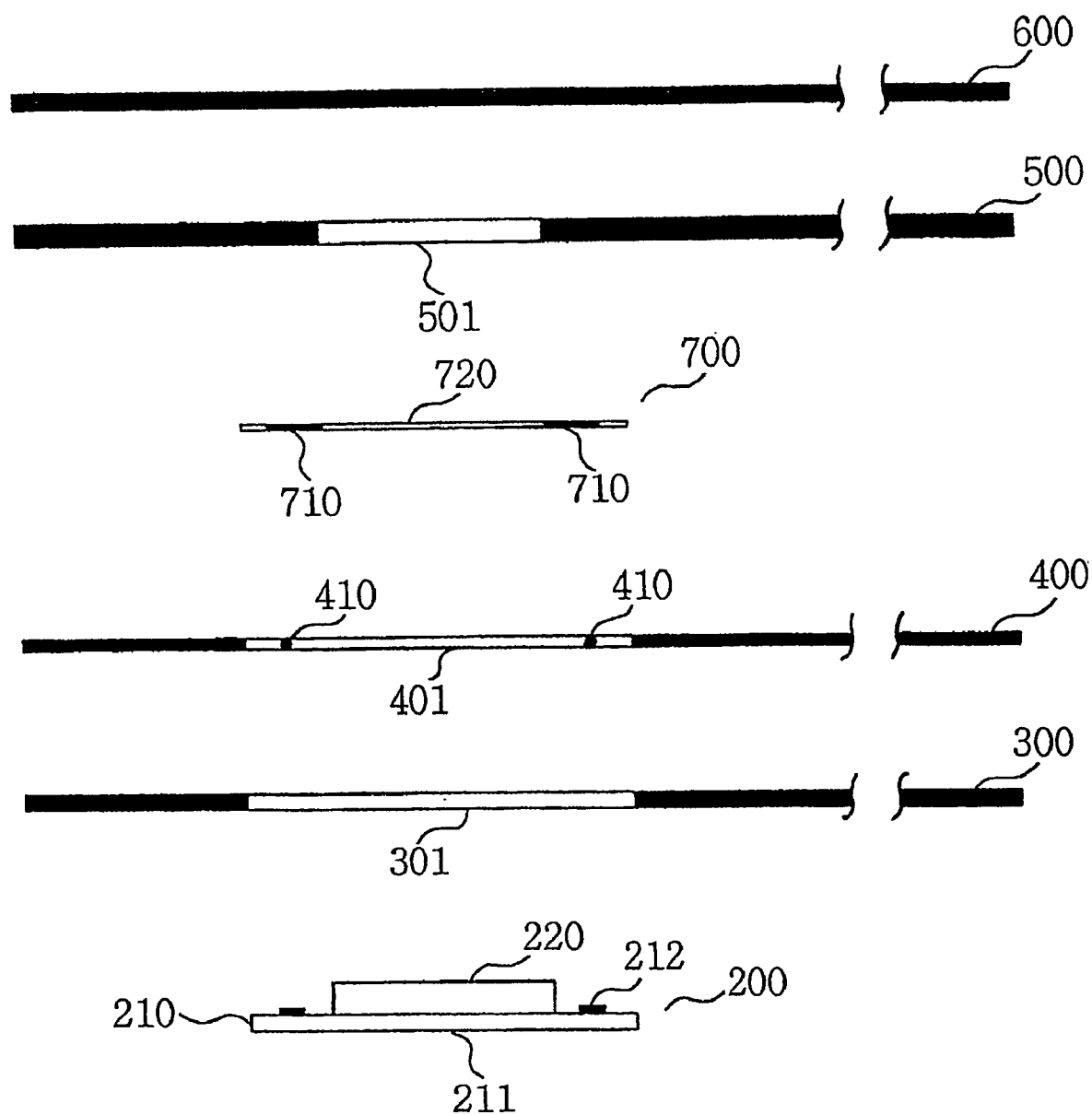
FIG. 3(B) is a cross-sectional view of the IC card shown in FIG. 3(A)

FIG. 3(A) is a perspective view shown to explain a method of manufacturing a dual-interface IC card according to another embodiment of the present invention, and FIG. 3(B) is a cross-sectional view of the dual-interface IC card shown in FIG. 3(A).

The method of manufacturing the dual-interface IC card according to FIG. 3(A) and FIG. 3(B) is a modified process of applying the hot melt sheet 700. In FIG. 2, the bottom of the hot melt sheet 700 is not directly adhered to the COB 200. However, in FIG. 3, after the front cover foil 300 and the antenna foil 400 are stacked on the COB 200, the bottom of the hot melt sheet 700 is adhered to the top of the COB 200 via the second hole 401 of the antenna foil 400. In this case, the hot melt sheet 700 still needs the central hole 720 for exposing the molding element 220, but does not need the sheet holes 710 for exposing the antenna electrodes 212. In other words, a worker can electrically connect the antenna connection elements 411 and the antenna electrodes 212 of the COB 200 with a sufficient visual field, while stacking the antenna foil 400. Thus, after such electrical connection, the worker can adhere the hot melt sheet 700 to the antenna foil 400. Accordingly, it does not matter if the hot melt sheet 700 is greater than the second hole 401. An adhesive strength with the core sheet 500 can be increased by using the hot melt sheet 700 having an area wider than that of the second hole 401.

Figure 4A:
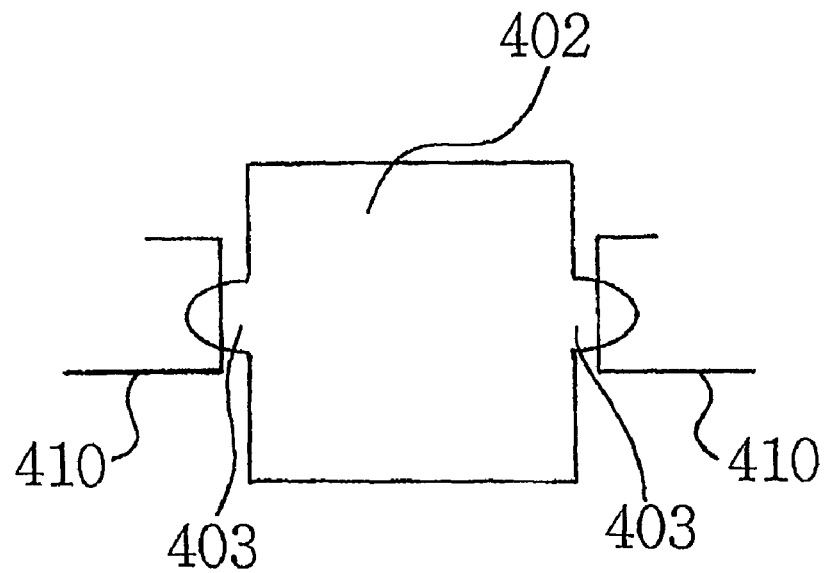
FIG. 4(A) and FIG. 4(B) are plane views each showing a second hole formed in an antenna sheet in the method of manufacturing the dual-interface IC card according to an embodiment of the present invention.
Figure 4B:
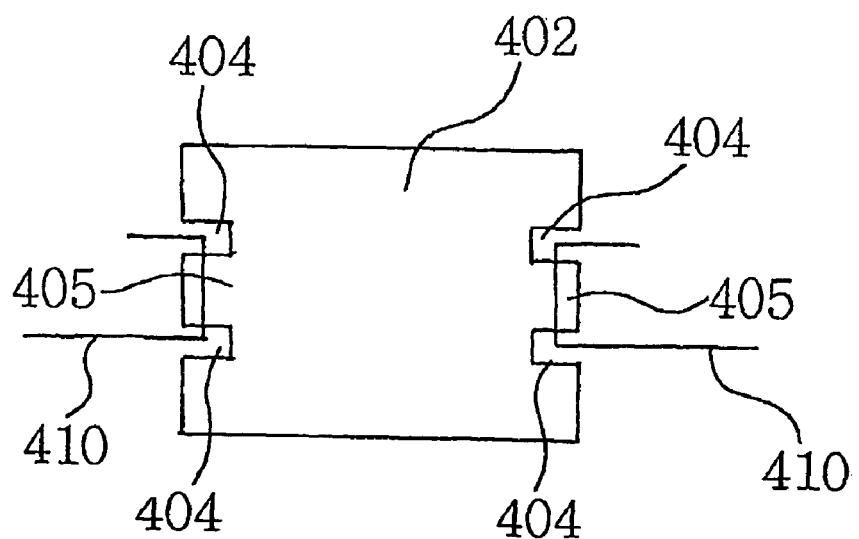

FIG. 4(A) and FIG. 4(B) are plane views each showing the second hole formed in the antenna sheet according to an embodiment of the present invention.

The second hole 401 is formed in the antenna foil 400 of the combi type IC card according to the present invention. It is necessary that the second hole 401 be formed so that the connection elements 411 of the antenna 410 and the antenna electrodes 212 of the COB 200 are seen within the visual field of the worker, i.e., from the upper direction. Accordingly, the second hole 401 includes a central portion 402 having the size greater than the area of the molding element 220 of the COB 200 so that the molding element 220 can be exposed from the upper direction (for reference, the inner side of a closed curve is the hole and the outer side thereof is the antenna foil in FIG. 4(A)), as shown in FIG. 4(A).

Furthermore, outer protrusions 403 of an ear shape that are outwardly protruded are formed at both sides of the central portion 402 so that the antenna electrodes 212 can be exposed from the upper direction. The connection elements 411 of the antenna 410 are formed to traverse the outer protrusions 403. Therefore, the worker can electrically connect the antenna connection elements 411 and the antenna electrodes 212 located below it through the holes of the outer protrusions 403. For reference, one side of both sides of the antenna foil 400 in which the antenna 410 is formed is oriented downwardly. In other words, the side in which the antenna 410 is formed becomes the side stacked on the front cover foil 300. It is preferable that the center points of the outer protrusions 403, the hot melt sheet holes 710 and the antenna electrodes 212 are coincident with one another on the plane.

If the hot melt sheet 700 is applied after the antenna foil 400 is stacked, it is preferred that the second hole 401 formed in the antenna foil 400 has a shape as shown in FIG. 4(B) (for reference, the inner side of a closed curve is the hole and an outer side thereof is the antenna foil in FIG. 4(B)). At this time, the central hole 402 having the size greater than the area of the molding element 220 of the COB 200 is formed in the second hole 401 so that the molding element 220 can be seen from the upper direction, i.e., by the worker's visual field. Further, a pair of inner protrusions 404 are protruded toward the inside of both sides of the central hole 402, and the up and down directions of both sides of the central hole 402 with them spaced apart by some distance, respectively. In other words, the four inner protrusions 404 are a portion of the antenna foil 400. In the connection elements 411 of the antenna 410, the distance between the pair of the inner protrusions 404 serves as a lateral holes 405 formed at the edge of the central hole 402.

Further, the connection elements 411 of the antenna 410 are formed to traverse the lateral holes 405. In other words, after stacking the antenna foil 400 in which only the pair of the lateral holes 405 are formed, the worker can electrically connect the antenna connection elements 411 and the antenna electrodes 212 of the COB 200 through the lateral holes 405 and then form the second hole 401 of a shape as shown in FIG. 4(B) in the antenna foil 400 by using a puncher, etc. Next, the hot melt sheet 700 is adhered on the second hole 401, wherein the molding element 220 is outwardly exposed and the hot melt sheet 700 having the size greater than the second hole 401 is employed.

Figure 5A:
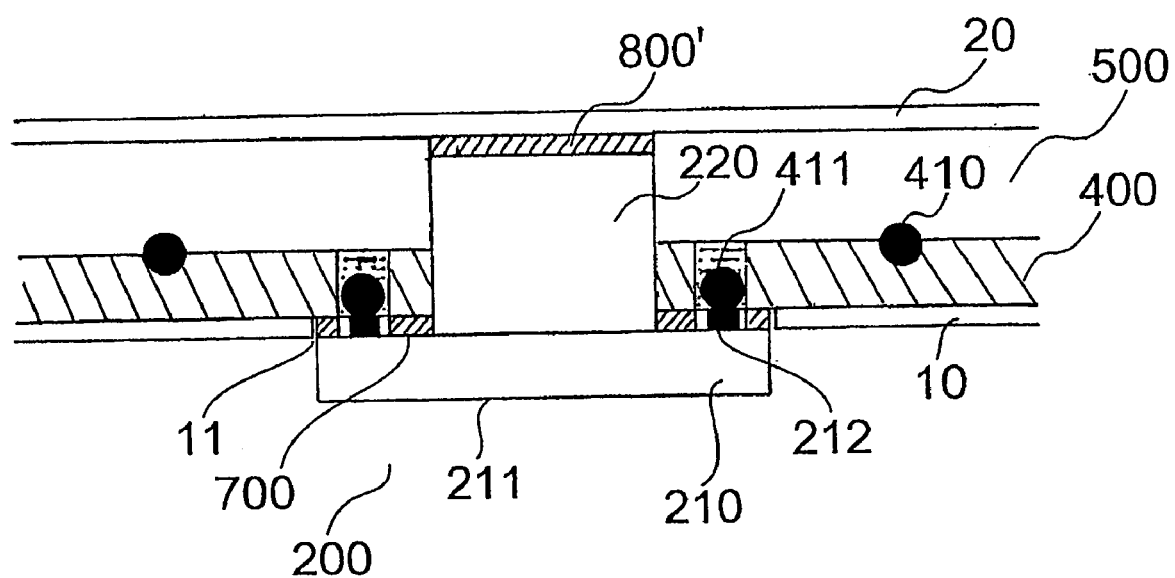
FIG. 5(A) is a traverse section view (taken along lines A-A' in FIG. 2(A)) of a dual-interface IC card on which a plurality of foils are stacked in a first step half-finished product manufacturing process according to an embodiment of the present invention.
Figure 5B:
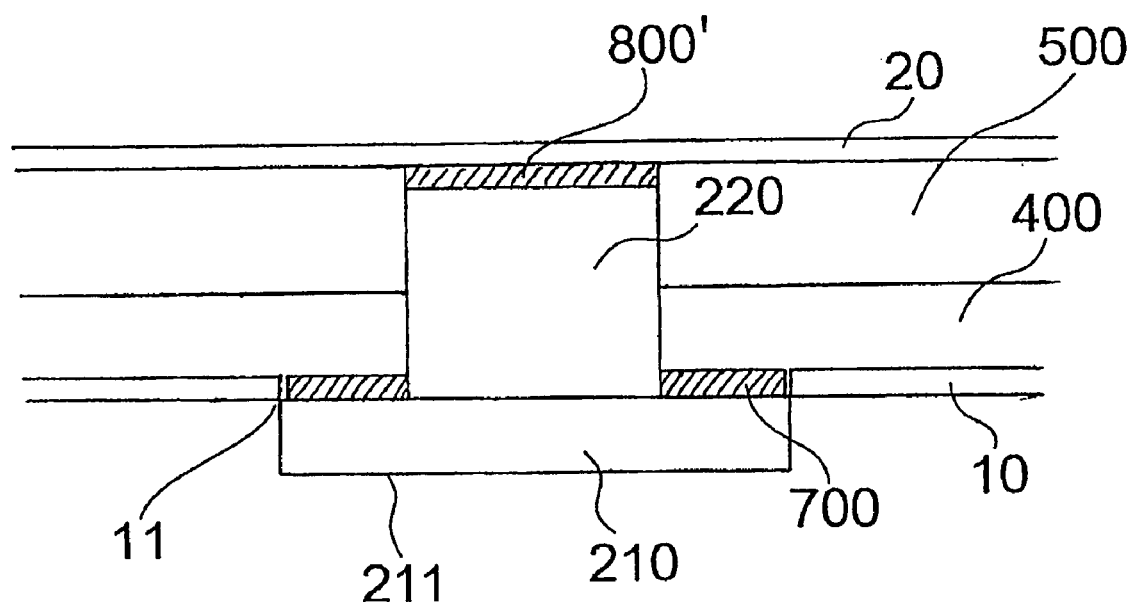
FIG. 5(B) is a longitudinal section view (taken along lines B-B' in FIG. 2(A)) of the IC card shown in FIG. 5(A)

FIG. 5(A) is a traverse section view (taken along lines A-A' in FIG. 2(A)) of the dual-interface IC card on which a plurality of foils are stacked in a first step half-finished product manufacturing process according to an embodiment of the present invention, and FIG. 5(B) is a longitudinal section view (taken along lines B-B' in FIG. 2(A)) of the IC card shown in FIG. 5(A). In this embodiment, the method of manufacturing the dual-interface IC card is composed of a first step half-finished product manufacturing process and a second step finished product manufacturing process. The first step process includes a process of manufacturing a basic IC card (i.e., the step of inserting the antenna foil and the core foil into the COB and then stacking them), and the second step process includes a process of stacking the printing foils, the coating foil and the like.

In the method of manufacturing the dual-interface IC card according to the present invention, the first step process being the half-finished product manufacturing process includes stacking a plurality of foils. A first work plate (not shown), which is generally flat and has a hole formed at its given place that has substantially the same shape and area as the main board 210 of the COB 200, is first laid on the floor (it is preferred that the first work plate has substantially the same thickness as the main board). The COB 200 whose electrode surface 211 is inserted downwardly is then located in the hole. It is preferable that the work plate is a metal plate of a predetermined thickness. This metal plate has an advantage that it can be easily compressed by heat as it is described later on. At this time, after a plurality of foils for the half-finished product to be described later are stacked, the COB 200 may be inserted into the work plate and then compressed without the need for the process of inserting the COB 200 into the work plate having the hole formed therein.

The bottom of the hot melt two-sided sheet 700 is adhered to portions except for the molding element 220 and the antenna electrodes 212 of the COB 200, and the top of the hot melt two-sided sheet 700 is adhered to the antenna foil 400 to be described later on. As an oilpaper is preferably formed on the top of the hot melt two-sided sheet 700, the bottom of the hot melt two-sided sheet 700 is adhered to the top of the COB 200 (adhesion by heat) and the oilpaper is then removed.

Therefore, the top of the hot melt two-sided sheet 700 can be adhered (adhered by heat) to the antenna foil 400. It is preferable that the hot melt sheet 700 does not protrude outwardly beyond the outermost edge portion of the COB 200, i.e., the main board 210 portion. It is more preferable that the portion adhered to the core foil 500 becomes widen by maximum by allowing the outermost edge of the hot melt sheet 700 to be substantially coincident with the outermost edge of the main board 210.

Furthermore, sheet holes 710 are formed or "⊏" shape grooves are formed in the portion where the hot melt sheet 700 makes contact with the antenna electrodes 212. Thus, the antenna connection elements 411 to be described later and the antenna electrodes 212 can be electrically connected through ultrasonic welding, adhesion using a conductive adhesive, soldering and the like. Further, a central hole 720 of substantially the same size as the area of the molding element 220 is formed in the central portion of the hot melt sheet 700. The molding element 220 of the COB 200 can be thus inserted into the central hole 720.

In the COB 200 having the hot melt sheet 700 adhered on its top, the antenna foil 400 in which the second hole 401 is formed at its predetermined location and the antenna 410 is formed at its one side, is laid on the work plate so that the molding element 220 and the antenna electrodes 212 of the COB 200 is exposed when viewed from the upper direction. In the above, the molding element 220 is inserted into the second hole 401. It may be preferred that the bottom of the antenna foil 400 keeps parallel with the bottom of the main board. As described later, however, it is possible to lay the other at least one foil (for example, a second overlay foil, etc.) before the antenna foil 400 is laid and then to stack the antenna foil 400 on the other at least one foil.

Furthermore, the step of applying the hot melt sheet 700 may be changed. In this case, the bottom of the hot melt sheet 700 is not directly adhered to the COB 200, but may be adhered to the top of the COB 200 through the second hole 401 of the antenna foil 400 after the second overlay foil 20 and the antenna foil 400 are stacked on the COB 200. In this case, the hot melt sheet 700 still needs the central hole 720 (see FIG. 2(A)) for exposing the molding element 220, but does not need the sheet holes 710 for exposing the antenna electrodes 212. In other words, a worker can electrically connect the antenna connection elements 411 and the antenna electrodes 212 of the COB 200 with a sufficient visual field, while stacking the antenna foil 400. Thus, after such electrical connection, the worker can adhere the hot melt sheet 700 to the antenna foil 400. Accordingly, it does not matter if the hot melt sheet 700 is greater than the second hole 401. An adhesive strength with the core sheet 500 can be increased by using the hot melt sheet 700 having an area wider than that of the second hole 401. In case where the hot melt sheet 700 is adhered after the antenna foil 400 is stacked as such, it is preferable that the second hole 401 has a shape shown in FIG. 4(B).

In the above, the second hole 401 may have a variety shapes. The molding element 220 and the antenna electrodes 212 may be exposed upwardly. Furthermore, it is required that both ends (the antenna connection elements 411 of the antenna 410 be adequately protruded toward the inside of the second hole. The antenna connection elements 411 have to be formed at a location corresponding to the antenna electrodes 212. Since technology for forming such an antenna connection elements 411 is known to those skilled in the art, detailed description on it will be omitted. In addition, the antenna foil 400 may be stacked after the antenna 410 is formed, or the antenna 410 may be formed after a foil having the antenna 401 not formed therein is stacked.

It is preferred that the antenna foil 400 is stacked after the second overlay foil 20 having a hole (hereinafter, referred to as "fifth hole" 11) of substantially the same area and shape as the main board 210 of the COB 200 is inserted into the molding element 220 of the COB 200, before the antenna foil 400 is stacked. In this case, given portions of the second overlay foil 20 and the antenna foil 400 are spot-adhered using ultrasonic waves, i.e., several points of them are tack-welded. By stacking the second overlay foil 20, it is possible to prevent the antenna 410 from being faintly seen from the outside in the finished IC card. Also, a difference in a thickness that is caused by the hot melt sheet 700 can be thus solved. By making the thickness of the antenna foil 400 sufficiently thick, i.e., by making the thickness of the antenna foil 400 substantially same as that of the molding element 220 of the COB 200, it is possible to make the thickness of the molding element 220 consisting of only the thickness of the second overlay foil 20 and the antenna foil 400. It is, however, preferable that the thickness of the antenna foil 400 is smaller than that of the molding element 220 and the step of stacking the core foil 500 is further included.

If the antenna connection elements 411 of the antenna foil 400 and the antenna electrodes 212 of the COB 200 are electrically connected, at least one core foil 500 having a third hole 501 of substantially the same shape and area as the molding element 220 is stacked. The third hole 501 is inserted into the molding element 220 of the COB 200. More preferably, before the core foil 500 is stacked (or while the plurality of the core foils are stacked, i.e., after one of two core foils is stacked), another hot melt sheet (not shown) enough to completely cover the molding element 220 of the COB 200 is adhered. This makes it possible to prevent a gap from generating between the molding element 220 and the antenna foil 400 or the core foil 500 in subsequent thermal compression. In particular, when a hot melt sheet is adhered between the antenna foil 400 and the core foil 500, the hot melt sheet is adapted to cover up to the second hole 401. This causes the hot melt sheet to melt, which fills the space around the antenna connection elements 411 in the second hole 401 in subsequent thermal compression.

If the core foil 500 is stacked, a first overlay foil 10 having any hole not formed therein is stacked. It is preferred that the first and second overlay foils 10 and 20 are relatively thinner in thickness than the antenna foil 400 and the core foil 500. It is more preferable that the height of the top of the core foil 500 is higher a little than the height of the molding element 220 of the COB 200 after the at least one core foil 500 is stacked. Furthermore, the upper portion of the molding element 220 corresponding to the difference between the heights of the core foil 500 and the molding element 220 is filled with a filler 800'. This makes the thickness of the foils thinner than the molding element 220 in subsequent thermal compression.

In other words, during the thermal compression, the thickness of the foils is reduced, while the thickness of the molding element 220 keeps same as before. It thus prevents the thickness of the foil layer from becoming thinner than that of the molding element 220 of the COB 200. The filler 800' may include an ultraviolet filler that is hardened by ultraviolet rays, an instant adhesive, an adhesive of an epoxy series that is hardened by heat, and so on. At this time, in case of the ultraviolet filler, it is hardened by ultraviolet rays after a transparent plate is placed on a portion to which the filler 800' is supplied. In case of the adhesive of an epoxy series, it is hardened by an additional heating means.

If the first overlay foil 10 is stacked, a second work plate that is substantially flat is laid on the first overlay foil 10 (when the first work plate is not initially laid, after the main board 210 of the COB 200 is inserted into the hole the first work plate). At least one work plate is then compressed while applying heat.

In the method of manufacturing the IC card according to the present invention, the second step process for manufacturing the IC card finished product is as follows.

With respect to the IC card half-finished product formed through the above-mentioned first step process, at least one foil having a hole (not shown) of substantially the same area as the main board of the COB is stacked below the second overlay foil 20. In the above, the thickness of the at least one foil must be not smaller than that of the main board of the COB (this is because the thickness of the foil portion may be reduced due to thermal compression). At this time, the at least one foil may be a printing foil, if necessary, or a coating foil for preventing abrasion. This corresponds to the front cover foil 300 shown in FIG. 2(A). Preferably, the step of stacking the other at least one foil (corresponding to the backside cover foil 600 in FIG. 2(A)) that will be coated on the first overlay foil 10, may be further included. Finally, the entire stacked foils are compressed while applying heat. The method of manufacturing the dual-interface IC card according to the present invention provides a method of manufacturing a dual-interface IC card having a high smoothness by means of twice thermal compressions; thermal compression in the half-finished product manufacturing process and thermal compression in the finished product manufacturing process.

Figure 6A:
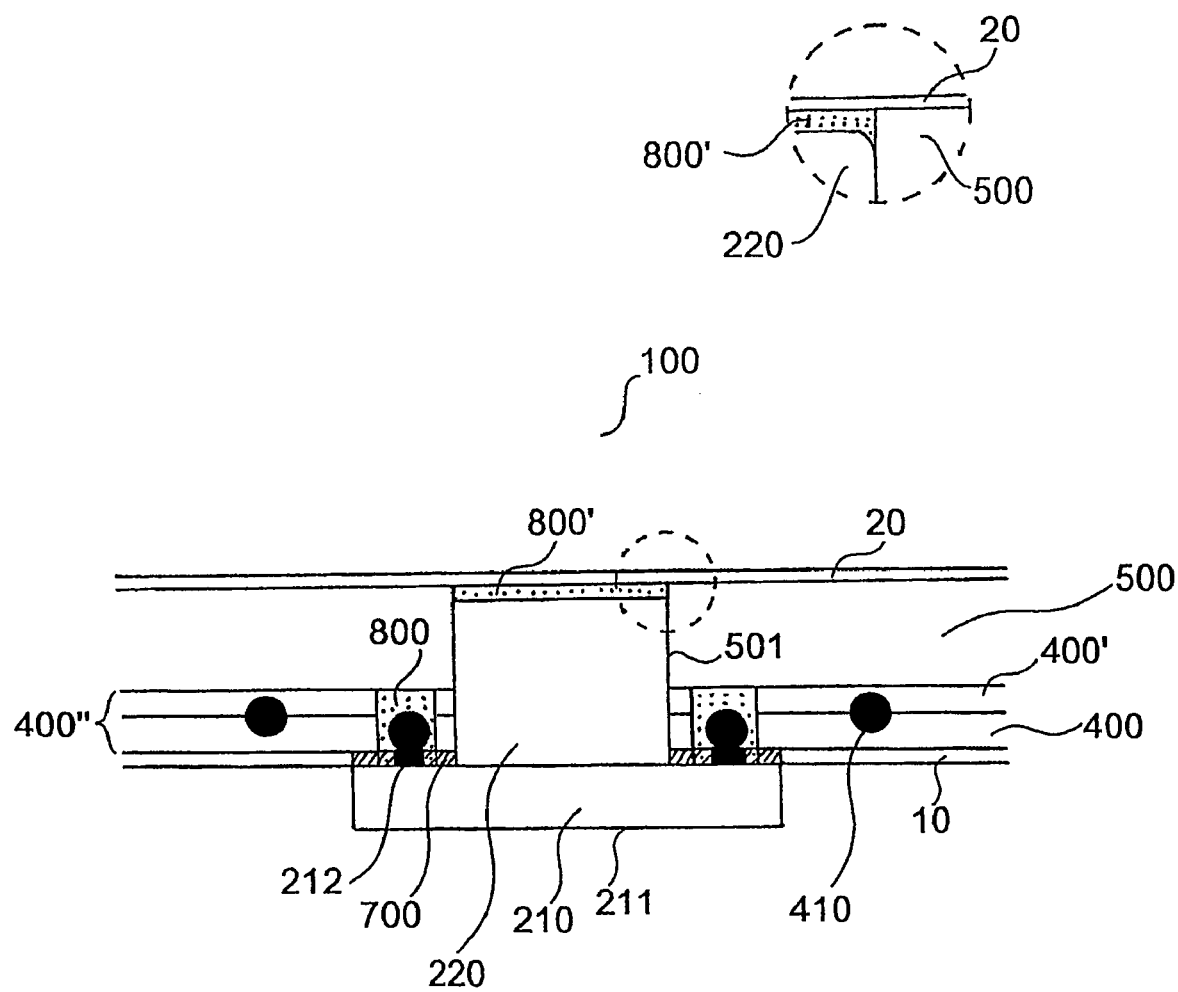
FIG. 6(A) is a traverse section view of a dual-interface IC card on which a plurality of foils are stacked in a first step half-finished product manufacturing process according to another embodiment of the present invention.
Figure 6B:
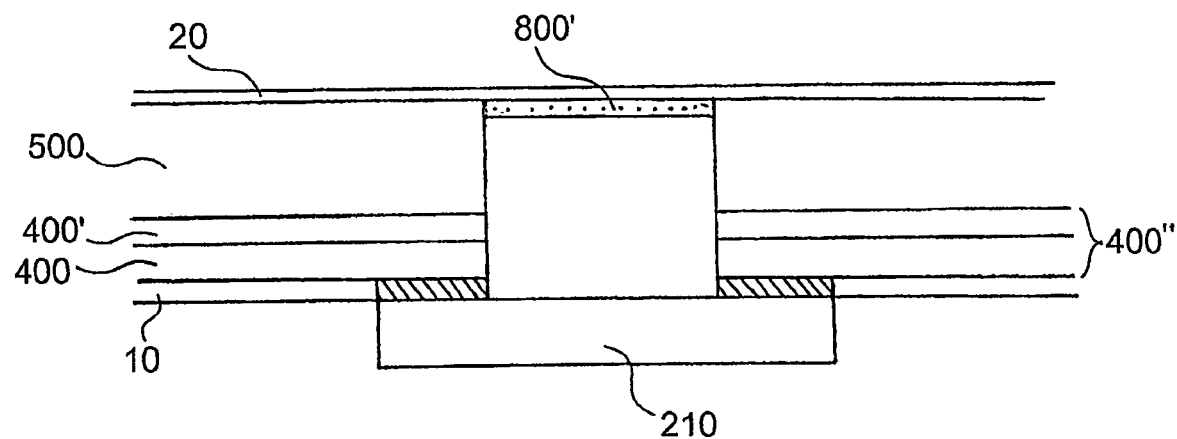
FIG. 6(B) is a longitudinal section view of the IC card shown in FIG. 6(A).

FIG. 6(A) is a traverse section view of a dual-interface IC card on which a plurality of foils are stacked in a first step half-finished product manufacturing process according to another embodiment of the present invention, and FIG. 6(B) is a longitudinal section view of the dual-interface IC card shown in FIG. 6(A).

In the method of manufacturing the dual-interface IC card according to the present invention, the first step process being the half-finished product manufacturing process also basically includes stacking a plurality of foils around a COB. However, before the plurality of the foils are stacked, the step of thermally compressing the antenna foil 400 and a lamination foil 400' to form a base foil 400" is first performed. The antenna foil 400 and the lamination foil 400' are first thermally expanded by thermally compressing them. A fourth hole 401" into which the molding element 220 of the COB 200 is inserted, i.e., through which the molding element 220 is exposed upwardly, is then formed. It is preferred that the antenna hole 402 for exposing the antenna connection elements 411 corresponding to both ends of the antenna 410 is formed in the antenna foil 400 and the lamination foil 400', before the antenna foil 400 and the lamination foil 400' are thermally compressed.

A worker can electrically connect the antenna connection elements 411 and the antenna electrodes 212 of the COB 200 through the antenna hole 402, by using soldering, ultrasonic welding, a conductive paste and the like. At this time, the antenna holes 402 have to be formed in two corresponding to a point where the antenna electrodes 212 of the COB 200 will be located. Those skilled in the art will appreciate that this can be easily implemented. After the antenna hole 402 is formed in each of the antenna foil 400 and the lamination foil 400', the antenna 410 of a predetermined shape is adequately wound on one side of the antenna foil 400. At this time, it is required that the antenna 410 traverses the antenna hole 402 and both ends of the antenna 410 traverse the antenna hole 402.

If the antenna 410 is formed, the lamination foil 400' is thermally compressed onto the antenna foil 400. It is preferred that the lamination foil 400' and the antenna foil 400 are thermally compressed so that the lamination foil 400' can cover the side in which the antenna 410 of the antenna foil 400 is formed. The two foil layers formed by such thermal compression become the base foil 400".

A fourth hole 401" into which the molding element 220 of the COB 200 is inserted, is formed in the base foil 400" that is formed by thermally compressing the antenna foil 400 and the lamination foil 400'. In this case, the fourth hole 401" must have an area through the molding element 220 of the COB 200 can be completely exposed when viewed from the upper direction. It is preferred that the fourth hole 401" has substantially the same shape and area as the molding element 220. This process of forming the fourth hole 401" may be performed by means of an automation process using a predetermined punching machine.

The process of forming the base foil 400" according to an embodiment of the present invention includes forming the antenna hole 402 and the second hole 401 in the antenna foil 400 and the lamination foil 400', respectively, winding the antenna 410 around the antenna foil 400, and then thermally compressing the antenna foil 400 and the lamination foil 400'. At this time, the antenna hole 402 and the second hole 401 have the same shape as that described above, and are suitable for a case where the degree that the foil is expanded is small or uniform even if the antenna hole 402 and the second hole 401 are thermally compressed.

The base foil 400" in which the fourth hole 401" is formed is inserted into the molding element 220 of the COB 200 through the fourth hole 401". The antenna connection elements 411 that traverses the base foil 400" and the molding element 220 via the antenna hole 402, and the antenna electrodes of the COB 200 are then electrically connected. A worker can secure a visual field through the antenna hole 402 and accordingly can obtain a strong physical connection such as soldering, ultrasonic welding and the like. At this time, a conductive paste may be used, if necessary, and all the methods for electrical connection may be used unless specially described.

Preferably, before the base foil 400" is inserted into the molding element 220 of the COB 200, the hot melt two-sided sheet 700, i.e., the bottom of a sheet where an adhesive material melt by heat is formed at its both sides is adhered (adhered by applying heat using additional device (device having a heater and a pressing plate)) to portions except for the molding element 220 and the antenna electrodes 212 of the COB 200. Hereinafter (that is, during thermal compression in the second step finished product manufacturing process), the top of the sheet is adhered to the base foil 400", which will be described later. In this case, the top of the hot melt sheet 700 and the base foil 400" may be adhered in advance using the additional device.

An oilpaper is preferably formed on the top of the hot melt two-sided sheet 700. At this time, the bottom of the hot melt two-sided sheet 700 is adhered (adhered by heat) to the top of the COB 200 and the oilpaper is then removed. Therefore, the top of the hot melt two-sided sheet 700 can be adhered (adhered by heat) to the base foil 400". It is preferable that the hot melt sheet 700 does not protrude outwardly beyond the outermost edge portion of the COB 200, i.e., the main board 210 portion. It is more preferable that the portion adhered to the core foil 500 becomes wide by maximum by allowing the outermost edge of the hot melt sheet 700 to be substantially coincident with the outermost edge of the main board 210.

Furthermore, sheet holes 710 are formed or "☐" shape grooves are formed in the portion where the hot melt sheet 700 makes contact with the antenna electrodes 212. Thus, the antenna connection elements 411 and the antenna electrodes 212 can be electrically connected through ultrasonic welding, adhesion using a conductive adhesive, soldering and the like. Further, a central hole of substantially the same size as the area of the molding element 220 is formed at the central portion of the hot melt sheet 700, whereby the molding element 220 can be inserted into the central hole. Or, a hole smaller than the area of the molding element 220 is formed at the central portion of the hot melt sheet 700, whereby a worker can strip off the oilpaper on the hot melt sheet 700 through the hole.

It is preferable that the bottom of the base foil 400 keeps parallel with the bottom of the main board. As described above, however, after the other at least one foil (for example, the second overlay foil 20 shown, etc.) is laid before the base foil 400" is laid, the base foil 400" may be stacked on the foil. At this time, it is possible to change the step of applying the hot melt sheet 700. In this case, the bottom of the hot melt sheet 700 is not directly adhered to the COB 200 unlike FIG. 2, but is adhered to the top of the COB 200 through the fourth hole 401" of the base foil 400" after the second overlay foil 20 and the antenna foil 400 are stacked on the COB 200.

In the above, the hot melt sheet 700 still requires a central hole 720 for exposing the molding element 220, but does not require sheet holes 710 for exposing the antenna electrodes 212. In other words, a worker can electrically connect the antenna connection elements 411 and the antenna electrodes 212 of the COB 200 with a sufficient visual field, while stacking the base foil 400". The worker can thus adhere the hot melt sheet 700 on it after such electrical connection. Accordingly, it does not matter if the hot melt sheet 700 is greater than the second hole 401. As the hot melt sheet 700 of the area wider than that of the second hole 401 is used, an adhesive strength with a core sheet 500 to be described later on can be increased.

If the antenna connection elements 411 of the base foil 400" and the antenna electrodes 212 of the COB 200 are connected, a filler 800 is supplied to the second hole 401 formed in the base foil 400" and the central hole 720 formed in the hot melt sheet 700. The IC card completed through the filler thus maintains a generally high smoothness. It is preferred that the adhesive property between the foils is improved by applying the filler 800 having the adhesive property. Such a filler 800 may include an ultraviolet filler that is hardened by ultraviolet rays, an instant adhesive, an adhesive of an epoxy series that is hardened by heat, and so on. At this time, in case of the ultraviolet filler, it is hardened by ultraviolet rays after a transparent plate is placed on a portion to which the filler 800' is supplied. In case of the adhesive of an epoxy series, it is hardened by an additional heating means.

As described above, it is preferred that the base foil 400" is stacked after the second overlay foil 20 having the first hole 301 of substantially the same area and shape as the main board 210 of the COB 200 is inserted into the molding element 220 of the COB 200. At this time, given portions of the second overlay foil 20 and the base foil 400" are spot-adhered, i.e., track-welded by means of ultrasonic waves. Stacking the second overlay foil 20 prevents the antenna 410 from being faintly viewed from the outside in the completed IC card. Further, it can solve a difference in the thickness occurring due to the hot melt sheet 700, as shown in the drawings.

If the filler 800 is applied and hardened, at least one core foil 500 (only one is shown in this drawing) having a third hole 501 of substantially the same shape and area as the molding element 220 is stacked. The third hole 501 is inserted into the molding element 220 of the COB 200. More preferably, before the core foil 500 is stacked (or while the plurality of the core foils are stacked, after one of two core foils is stacked), the other hot melt sheet (not shown) is adhered enough to completely cover the molding element 220 of the COB 200. It prevents a gap from occurring between the molding element 220 and the base foil 400" or the core foil 500 in subsequent thermal compression. In particular, if a hot melt sheet is adhered between the base foil 400" and the core foil 500, the hot melt sheet can cover the fourth hole 401". Thereby, in subsequent thermal compression, the hot melt sheet is melt to fill the space around the antenna connection elements 411 in the fourth hole 401".

The antenna foil 400 and the lamination foil 400' may be formed sufficiently thick as much thickness as the core foil 500 without stacking such a core foil 500. In other words, assuming that a thickness of the molding element 220 is about 0.42 mm, a thickness of the antenna foil 400 and a thickness of the lamination foil 400' may be set to about 0.11 mm and 0.11 mm (or may be different), respectively, and the core foil 500 of 0.22 mm may be then stacked on it, or a thickness of the antenna foil 400 and a thickness of the lamination foil 400' may be set to 0.22 mm and 0.22 mm and the core foil 500 may be omitted.

If the core foil 500 is stacked, the first overlay foil 10 having a hole not formed therein is stacked. It is preferable that the first and second overlay foils 10 and 20 are relatively thinner in thickness than the base foil 400" and the core foil 500. After the at least one core foil 500 is stacked, it is not required that the height of the top of the core foil 500 be necessarily the same as the height of the molding element 220.

In other words, in case where the filler 800' is filled into the upper portion of the molding element 220 corresponding to a difference between the heights of the core foil 500 and the molding element 220 and is thermally compressed later, the thickness of the foils is not made thinner than the molding element 220 since the height of the top of the core foil 500 is slightly higher than the height of the molding element 220 of the COB 200. In other words, once being thermally compressed, the thickness of the foils is reduced, while the thickness of the molding element 220 is same as before. It prevents the thickness of the foil layer from becoming thinner than that of the molding element 220 of the COB 200.

Furthermore, referring to the expanded drawing (indicated by dotted lines in FIG. 6(A)) with respect to the filler 800' applied between the core foil 500 and the molding element 220, the edge of the molding element 220 does not have an exact rectangular edge shape but a smoothly curved shape. Thus, the smoothness of the final IC card can be further improved by filling the gap between the molding element 220 and the core foil 500 with the filler 800'. The filler 800' may be the same as the filler 800. Of course, the top of the core foil 500 may be formed lower than the molding element 220 of the COB 200.

In the method for manufacturing the dual-interface IC card, the second step process of manufacturing the dual-interface IC card finished product is as follows.

In the dual-interface IC card half-finished product that is formed by the first step process, at least one foil (corresponding to the front cover foil 300 in FIG. 2(A)) having a hole (not shown) of substantially the same area as the main board 210 of the COB 200 is stacked below the second overlay foil 20. At this time, the area of the at least one foil is not smaller than the thickness of the main board of the COB (this is because the thickness of the foil portion can be reduced due to thermal compression). At this time, the at least one foil may include a printing foil, if necessary, and a coating foil for preventing abrasion. It is preferred that the step of stacking the other at least one foil (corresponding to the backside cover foil 600 in FIG. 2(A)) that will be coated on the first overlay foil 10 may be further included. Finally, the stacked entire foils are compressed while applying heat.

As described above, the present invention provides a method of solving a problem that may happen as an antenna foil is contracted due to first thermal compression, while manufacturing an IC card of a higher smoothness through twice thermal compressions; thermal compression in a half-finished product manufacturing process and thermal compression in a finished product manufacturing process.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method for manufacturing a dual-interface IC card comprising the steps of:

providing a COB (chip on board) having a pair of antenna electrodes on a main board and an IC chip mounted thereon;

providing a hot melt sheet having a pair of sheet holes so that the antenna electrodes are exposed, and having a central hole so that the IC chip is inserted into the central hole;

providing an antenna foil having a second hole whose size is smaller than those of the COB and the hot melt sheet, and having an antenna wound on the antenna foil to be connected to the antenna electrodes;

providing a core foil having a third hole whose size is equivalent to that of the IC chip, so that the IC chip is inserted into the third hole and the hot melt sheet is adhered;

connecting electrically the antenna connection elements of the antenna to the antenna electrodes; and heat-pressing the laminated structure of the COB, the hot melt sheet, the antenna foil and the core foil.

2. The method as defined in claim 1, which further comprises the step of:

inserting a front cover foil under the antenna foil, wherein the front cover foil has a first hole whose size is equivalent to that of the second hole on the antenna foil.

3. The method as defined in claim 2, which further comprises the step of:

laminating a backside cover foil on the core foil.

4. The method as defined in claim 1, wherein said step of connecting electrically the antenna connection elements to the antenna electrodes is conducted by ultrasonic welding, adhesion using a conductive adhesive, or soldering between the antenna connection elements and the antenna electrodes.

5. A dual-interface IC card comprising:

a COB having a pair of antenna electrodes on a main board and an IC chip mounted thereon;

a hot melt sheet having a pair of sheet holes so that the antenna electrodes are exposed, and having a central hole so that the IC chip is inserted into the central hole;

an antenna foil having a second hole whose size is smaller than those of the COB and the hot melt sheet, and having an antenna wound on the antenna foil to be connected to the antenna electrodes; and a core foil having a third hole whose size is equivalent to that of the IC chip, so that the IC chip is inserted into the third hole and the hot melt sheet is adhered;

wherein said dual-interface IC card is manufactured by laminating the COB, the hot melt sheet, the antenna foil and the core foil, connecting electrically the antenna connection elements of the antenna wound on the antenna foil to antenna electrodes of the COB, and heat-pressing the laminated structure of the COB, the hot melt sheet, the antenna foil and the core foil.

6. The dual-interface IC card as defined in claim 5, which further comprises a front cover foil under the antenna foil, wherein the front cover foil has a first hole whose size is equivalent to that of the second hole on the antenna foil.

7. The dual-interface IC card as defined in claim 6, which further comprises a backside cover foil on the core foil.

8. A method for manufacturing a dual-interface IC card comprising the steps of:
   providing a COB having a pair of antenna electrodes on a main board and an IC chip mounted thereon;
   providing an antenna foil having a second hole whose size is equivalent to that of the COB, and having an antenna wound on the antenna foil to be connected to the antenna electrodes of the COB;
   providing a hot melt sheet having a central hole so that the IC chip is inserted into the central hole and the size of the central hole is larger than that of the second hole to cover the second hole;
   providing a core foil having a third hole whose size is equivalent to that of the IC chip, so that the IC chip is inserted into the third hole and the hot melt sheet is adhered;
   connecting electrically the antenna connection elements of the antenna to the antenna electrodes; and
   heat-pressing the laminated structure of the COB, the antenna foil, the hot melt sheet and the core foil.

9. The method as defined in claim 8, which further comprises the step of:
   inserting a front cover foil under the antenna foil, wherein the front cover foil has a first hole whose size is equivalent to that of the second hole on the antenna foil.

10. The method as defined in claim 9, which further comprises the step of:
    laminating a backside cover foil over the core foil.

11. The method as defined in claim 8, wherein said step of connecting electrically the antenna connection elements to the antenna electrodes is conducted by ultrasonic welding, adhesion using a conductive adhesive, or soldering between the antenna connection elements and the antenna electrodes.

12. A dual-interface IC card comprising:
    a COB having a pair of antenna electrodes on a main board and an IC chip mounted thereon;
    an antenna foil having a second hole whose size is equivalent to that of the COB, and having an antenna wound on the antenna foil to be connected to the antenna electrodes of the COB;
    a hot melt sheet having a central hole so that the IC chip is inserted into the central hole and the size of the central hole is larger than that of the second hole to cover the second hole; and
    a core foil having a third hole whose size is equivalent to that of the IC chip, so that the IC chip is inserted into the third hole and the hot melt sheet is adhered;
    wherein said dual-interface IC card is manufactured by laminating a COB, an antenna foil, a hot melt sheet and a core foil, connecting electrically the antenna connection elements of the antenna wound on the antenna foil to antenna electrodes of the COB, and heat-pressing the laminated structure of the COB, the antenna foil, a hot melt sheet and the core foil.

13. The dual-interface IC card as defined in claim 12, which further comprises a front cover foil under the antenna foil, wherein the front cover foil has a first hole whose size is equivalent to that of the second hole on the antenna foil.

14. The dual-interface IC card as defined in claim 13, which further comprises a backside cover foil over the core foil.

15. A method for manufacturing a half-finished dual-interface IC card comprising the steps of:
    providing a COB having a pair of antenna electrodes on a main board and an IC chip mounted thereon;
    providing a hot melt sheet having a pair of sheet holes so that the antenna electrodes are exposed, and having a central hole so that the IC chip is inserted into the central hole;
    providing an antenna foil having a second hole whose size is smaller than those of the COB and the hot melt sheet, and having an antenna wound on the antenna foil to be connected to the antenna electrodes;
    providing a core foil having a third hole whose size is equivalent to that of the IC chip, so that the IC chip is inserted into the third hole and the hot melt sheet is adhered;
    providing a first overlay foil to be laminated on the core foil;
    connecting electrically the antenna connection elements of the antenna to the antenna electrodes;
    filling a gap between the molding element of the COB and the first overlay foil with a filler; and
    heat-pressing the laminated structure of the COB, the hot melt sheet, the antenna foil, the core foil and the first overlay foil.

16. The method as defined in claim 15, which further comprises the step of:
    inserting a second overlay foil under the antenna foil, wherein the second overlay foil has a fifth hole whose size is equivalent to that of the second hole on the antenna foil.

17. The method as defined in claim 15, wherein said step of connecting electrically the antenna connection elements to the antenna electrodes is conducted by ultrasonic welding, adhesion using a conductive adhesive, or soldering between the antenna connection elements and the antenna electrodes.

18. A half-finished dual-interface IC card comprising:
    a COB having a pair of antenna electrodes on a main board and an IC chip mounted thereon;
    a hot melt sheet having a pair of sheet holes so that the antenna electrodes are exposed, and having a central hole so that the IC chip is inserted into the central hole;
    an antenna foil having a second hole whose size is smaller than those of the COB and the hot melt sheet, and having an antenna wound on the antenna foil to be connected to the antenna electrodes;
    a core foil having a third hole whose size is equivalent to that of the IC chip, so that the IC chip is inserted into the third hole and the hot melt sheet is adhered; and
    a first overlay foil to be laminated on the core foil;
    wherein said half-finished dual-interface IC card is manufactured by laminating the COB, the hot melt sheet, the antenna foil and the core foil, connecting electrically the antenna connection elements of the antenna wound on the antenna foil to the antenna electrodes of the COB, filling a gap between the molding element of the COB and the first overlay foil with a filler and heat-pressing the laminated structure of the COB, the hot melt sheet, the antenna foil and the first overlay foil.

19. The half-finished dual-interface IC card as defined in claim 18, which further comprises:
    a second overlay foil under the antenna foil, wherein the second overlay foil has a fifth hole whose size is equivalent to that of the second hole on the antenna foil.

20. A method for manufacturing a half-finished dual-interface IC card comprising the steps of:
providing a COB having a pair of antenna electrodes on a main board and an IC chip mounted thereon;
providing an antenna foil having a second hole whose size is equivalent to that of the COB, and having an antenna wound on the antenna foil to be connected to the antenna electrodes of the COB;
providing a hot melt sheet having a central hole so that the IC chip is inserted into the central hole and the size of the central hole is larger than that of the second hole to cover the second hole;
providing a core foil having a third hole whose size is equivalent to that of the IC chip, so that the IC chip is inserted into the third hole and the hot melt sheet is adhered;
providing a first overlay foil to be laminated on the core foil;
connecting electrically the antenna connection elements of the antenna to the antenna electrodes;
filling a gap between the molding element of the COB and the first overlay foil with a filler; and
heat-pressing the laminated structure of the COB, the antenna foil, the hot melt sheet, the core foil and the first overlay foil.

21. The method as defined in claim 20, which further comprises the step of:
inserting a second overlay foil under the antenna foil, wherein the second overlay foil has a fifth hole whose size is equivalent to that of the second hole on the antenna foil.

22. The method as defined in claim 20, wherein said step of connecting electrically the antenna connection elements to the antenna electrodes is conducted by ultrasonic welding, adhesion using a conductive adhesive, or soldering between the antenna connection elements and the antenna electrodes.

23. A half-finished dual-interface IC card comprising:
a COB having a pair of antenna electrodes on a main board and an IC chip mounted thereon;
an antenna foil having a second hole whose size is equivalent to that of the COB, and having an antenna wound on the antenna foil to be connected to the antenna electrodes of the COB;
a hot melt sheet having a central hole so that the IC chip is inserted into the central hole and the size of the central hole is larger than that of the second hole to cover the second hole;
a core foil having a third hole whose size is equivalent to that of the IC chip, so that the IC chip is inserted into the third hole and the hot melt sheet is adhered; and
a first overlay foil to be laminated on the core foil;
wherein said half-finished dual-interface IC card is manufactured by laminating the COB, the antenna foil, the hot melt sheet and the core foil, connecting electrically the antenna connection elements of the antenna wound on the antenna foil to the antenna electrodes of the COB, filling a gap between the molding element of the COB and the first overlay foil with a filler and heat-pressing the laminated structure of the COB, the antenna foil, the hot melt sheet, the core foil and the first overlay foil.

24. The half-finished dual-interface IC card as defined in claim 23, which further comprises:
a second overlay foil under the antenna foil, wherein the second overlay foil has a fifth hole whose size is equivalent to that of the second hole on the antenna foil.

25. A method for manufacturing a half-finished dual-interface IC card comprising the steps of:
providing a COB having a pair of antenna electrodes on a main board and an IC chip mounted thereon having a molding element in the middle of the main board;
providing a hot melt sheet having a pair of sheet holes so that the antenna electrodes are exposed, and having a central hole so that the molding element is inserted into the central hole;
providing a second overlay foil having a fifth hole so that the hot melt sheet is inserted into the fifth hole;
providing a base foil having a fourth hole so as to be laminated on the second overlay foil, a pair of antenna holes into which the antenna connection elements are inserted, and an antenna wound in the base foil;
connecting the antenna connection elements to the antenna electrodes electrically;
filling the upper gaps of the antenna and the molding element with fillers;
providing a first overlay foil to be laminated on the base foil; and
compressing the laminated structure with the first overlay foil thermally;
wherein the thickness of the second overlay foil and the base foil is equivalent to that of the molding element and the filler.

26. The method as defined in claim 25, wherein said base foil further comprises:
an antenna foil and a lamination foil laminated on the antenna foil;
wherein the antenna is wound on the antenna foil and the lamination foil is laminated on the antenna foil.

27. The method as defined in claim 25, which further comprises the step of:
providing a core foil between the base foil and the first overlay foil, wherein the core foil has a third hole into which the molding elements is inserted;
wherein the thickness of the second overlay foil, the base foil and the core foil is equivalent to that of the molding element and the filler.

28. A half-finished dual-interface IC card comprises:
a COB having a pair of antenna electrodes on a main board and an IC chip mounted thereon having a molding element in the middle of the main board;
a hot melt sheet having a pair of sheet holes so that the antenna electrodes are exposed, and having a central hole so that the molding element is inserted into the central hole;
a second overlay foil having a fifth hole so that the hot melt sheet is inserted into the fifth hole;
a base foil having a fourth hole so as to be laminated on the second overlay foil, a pair of antenna holes into which the antenna connection elements are inserted, and an antenna wound in the base foil; and
a first overlay foil to be laminated on the base foil;
wherein said half-finished dual-interface IC card is manufactured by connecting the antenna connection elements to the antenna electrodes electrically, filling the upper gaps of the antenna and the molding element with fillers and heat-pressing the laminated structure of the COB, the hot melt sheet, the second overlay foil, the base foil and the first overlay foil;
wherein the thickness of the second overlay foil and the base foil is equivalent to that of the molding element and the filler.

29. The half-finished dual-interface IC card as defined in claim 28, wherein said base foil further comprises:
an antenna foil and a lamination foil laminated on the antenna foil;
wherein the antenna is wound on the antenna foil and the lamination foil is laminated on the antenna foil.

30. The half-finished dual-interface IC card as defined in claim 28, which further comprises:
a core foil between the base foil and the first overlay foil, wherein the core foil has a third hole into which the molding elements is inserted;
wherein the thickness of the second overlay foil, the base foil and the core foil is equivalent to that of the molding element and the filler.

\* \* \* \* \*